United States Patent [19]

Stahl

[11] Patent Number: 4,868,505

[45] Date of Patent: Sep. 19, 1989

[54] HIGH VOLTAGE IMPULSE WAVE GENERATOR FOR TESTING EQUIPMENT

[76] Inventor: George J. Stahl, 428 Ben Oaks Dr., East, Severna Park, Md. 21146

[21] Appl. No.: 204,324

[22] Filed: Jun. 9, 1988

[51] Int. Cl.$^4$ .................. G01R 31/02; H03K 3/01
[52] U.S. Cl. .......................... 324/511; 324/510; 324/546; 307/107
[58] Field of Search ....... 324/57 PS, 500, 509-14 511, 324/527, 531, 536, 537, 539, 541, 546, 547, 551-554, 73 R, 158 MG, 545, 55; 361/111; 328/65-67; 307/268, 106-108

[56] References Cited

U.S. PATENT DOCUMENTS 2,578,499  12/1951  Bauer ................................ 324/546
3,622,882  11/1971  Gardner ...................... 324/158 MG
3,869,664   3/1975  Safer et al. ......................... 324/546
3,932,806   1/1976  Kawada ............................. 324/546
4,683,514   7/1987  Cook .................................. 361/111

Primary Examiner—Reinhard J. Eisenzopf
Assistant Examiner—Jack B. Harvey
Attorney, Agent, or Firm—Luther A. Marsh; John H. Stowe

[57] ABSTRACT

A generator for subjecting an electrical apparatus to a surge voltage. The generator includes a surge voltage generator, a line isolation surge filter, wave shaping circuits and a rectifier coupling network for coupling the surge voltages in shunt with the power line and the equipment under test.

25 Claims, 4 Drawing Sheets

HIGH VOLTAGE IMPULSE WAVE GENERATOR FOR TESTING EQUIPMENT

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1. Field of the Invention

This invention relates to the field of testing electrical and electronic apparatus and more specifically to the field of testing the susceptibility of the apparatus to damage or malfunction caused by voltage surges which may exist on incoming power lines.

2. Background Information

Generally, impulses or surges-result from the effects of lightning strikes on the power lines or from switching transients on the power lines. Typically, switching transients occur when the power input to some electromagnetic device elsewhere on the power line is switched, rapidly releasing energy back into the system causing a surge waveform to be impressed on the normal power line waveform or when a loaded power line is suddenly unloaded. In the testing of equipment for tolerance to these conditions, two industry standards exist which specify the amplitude and duration of a unidirectional surge waveform. These are the Institute of Electrical and Electronic Engineers (IEEE) Standard 587-1980 and the Department of Defense Standard DOD-STD-1399, section 300 (Navy). In each of these standards, the intensity of the surge waveform is specified in terms of a peak voltage amplitude normally expressed in kilovolts (kv) and a duration normally expressed in microseconds (us). Commonly, this surge waveform is expressed simply as for example, 1.2×50, meaning a wave shape with a rise time of 1.2 microseconds and a duration of 50 microseconds from the virtual zero time of the voltage wave to the time where the voltage wave has decayed to one-half of its peak voltage amplitude. The peak voltage amplitude of this test surge is specified as 2.5 kv in DOD-STD-1399 and 6 kv in IEEE STD 587-1980.

Presently available surge voltage generators apply test surge waves into equipment operating on ac or dc power lines by series injection or by capacitive coupling. In these equipments, test surges are commonly created by charging a high voltage capacitor to the desired voltage level and then discharging it through a triggered switch such as an ignitron or a triggered spark gap.

In the series injection method, the capacitor is discharged into a resistor and air core inductor connected in parallel, the parallel combination then being electrically in series with the power line. The surge which is developed across the parallel load is thereby superimposed on the power line voltage with this configuration. The surge voltage is divided between the input impedance of the equipment under test (EUT) and the power source impedance. The surge width is determined by the component values chosen for the discharge capacitor and the resistor-inductor combination. The impedance of the resistor and inductor is made very low to reduce the effect of the system impedance and the input impedance of the EUT on the width of the surge. Typically, a capacitor of 10 microfarad (uF) or greater is connected across the power line before the parallel load and the EUT. The capacitor presents a low source impedance to the surge and ensures that nearly all of the surge voltage appears across the inputs of the EUT. Further, this capacitor protects the power line and other equipment operating from it from the effects of the surge. The series inductor carries the normal full line current of the EUT, hence the wire size of the inductor must be selected accordingly. In instances where the EUT draws hundreds of amperes, the inductor will be quite large and can also cause a phase voltage unbalance in three-phase power systems. This unbalance can be substantial, especially in 400 Hertz (Hz) power systems such as are used on ships and aircraft. In these instances, inductors are required to be added to the other two phases to maintain voltage balance. This further limits the capacity of systems which can be tested and results in a set up procedure that requires either using the EUT under test to calibrate the surge or laboriously simulating the impedance of the EUT for the purpose of calibrating the source of the surge.

Depending on the inductance value, a significant voltage drop may occur in the voltage level to the EUT. Since the surge voltage generated in this manner is superimposed on the line voltage, in alternating systems, it will exceed a preset peak voltage at the 240 degree point in one phase when it is applied at the zero-crossing in another phase. Another limitation of the series injection method is that line-to-ground surges cannot be generated by the series injection method.

Presently, voltage surges are also applied to power lines through coupling capacitors. This method is applicable where the power lines can operate normally with the coupling capacitor connected across them. The fraction of the energy in the surge wave delivered to the load is small unless the coupling capacitor is a very large value. With such a high value capacitor, it is difficult to turn on the power source due to a large inrush of current. This problem is more severe if a 4×200 surge test waveform is used.

A disadvantage to both the series injected and capacitively coupled methods of surge generation is that the waveform is superimposed on the waveform of the normal power source. Thus, if the surge occurs at the positive peak of the power waveform, the peak of the surge will be higher than if the surge occurs at the negative peak of the power waveform.

The present invention avoids the disadvantages of both the series injected and capacitively coupled methods of surge generation by applying the surge voltage directly in shunt across the power line through a rectifier wave coupling network, thus repeating the peak voltage each time the surge is applied to the power line waveform.

SUMMARY OF THE INVENTION

Advantages of the Invention

In the present invention, the surge voltage is applied directly in shunt across the power line through a rectifier wave coupling network rather than superimposed on the line voltage by capacitive coupling or series injection. Thus, the same repeatable peak voltage is obtained each time the surge is applied to the power line waveform. Further, the normal line current to the EUT does not pass through the wave shaping load, thus eliminating excessive voltage drops and imbalances which occur when series injection is used in high current applications.

Either line-to-line or line-to-ground surges are coupled to an electrical system in a manner such that a larger portion of the available surge energy is delivered to the EUT than that which occurs with the capacitive coupling method of surge generation.

Surges of longer duration are generated and imposed on an electrical power system more readily than can be achieved with apparatus using the series injection or capacitive coupling methods.

The leakage or standby current is reduced compared with the capacitive coupling and series injection methods. Additionally, a means for limiting inrush current is not required as is required in the capacitive coupling method.

In the present invention, an apparatus for subjecting an equipment under test to an impulse waveform, said equipment under test being operated from an electrical power source, comprises: a surge filter having first and second inputs connected to said power source and first and second outputs connected to first and second inputs of said equipment under test; an impulse generator having a first output connected to said first output of said surge filter and having a second output; a wave shaping network having a first input connected to said first output of said surge filter and having a second input; a first rectifier wave coupling network having an input switchedly connected to the second output of said impulse generator, said first rectifier wave coupling network having an output connected to said second input of said wave shaping network; and, a second rectifier wave coupling network, said second rectifier coupling network having an input connected to the input of said first rectifier coupling network and an output connected to said second output of said surge filter.

Objects of the Invention

It is an object to this invention to provide an improved surge voltage test apparatus for electrical and electronic equipment.

It is a further object of this invention to provide a surge voltage test apparatus which eliminates power line voltage unbalances inherent in testing apparatus using the series injection generation method.

It is yet a further object to this invention to provide a surge voltage test apparatus to generate a voltage surge having an amplitude determinable without reference to the magnitude of the line voltage at the time the surge is applied to the EUT.

It is yet a further object of this invention to provide a surge voltage test apparatus for applying surge voltages to equipment operating on either alternating or direct current.

It is yet a further object of this invention to provide a surge voltage test apparatus having a wide range of adjustment of both the amplitude and duration of the surge voltage waveform.

Other objects and advantages of the present invention will be apparent by reference to the specifications and drawings, wherein:

DESCRIPTION OF THE PREFERRED EMBODIMENT

Figure 1:
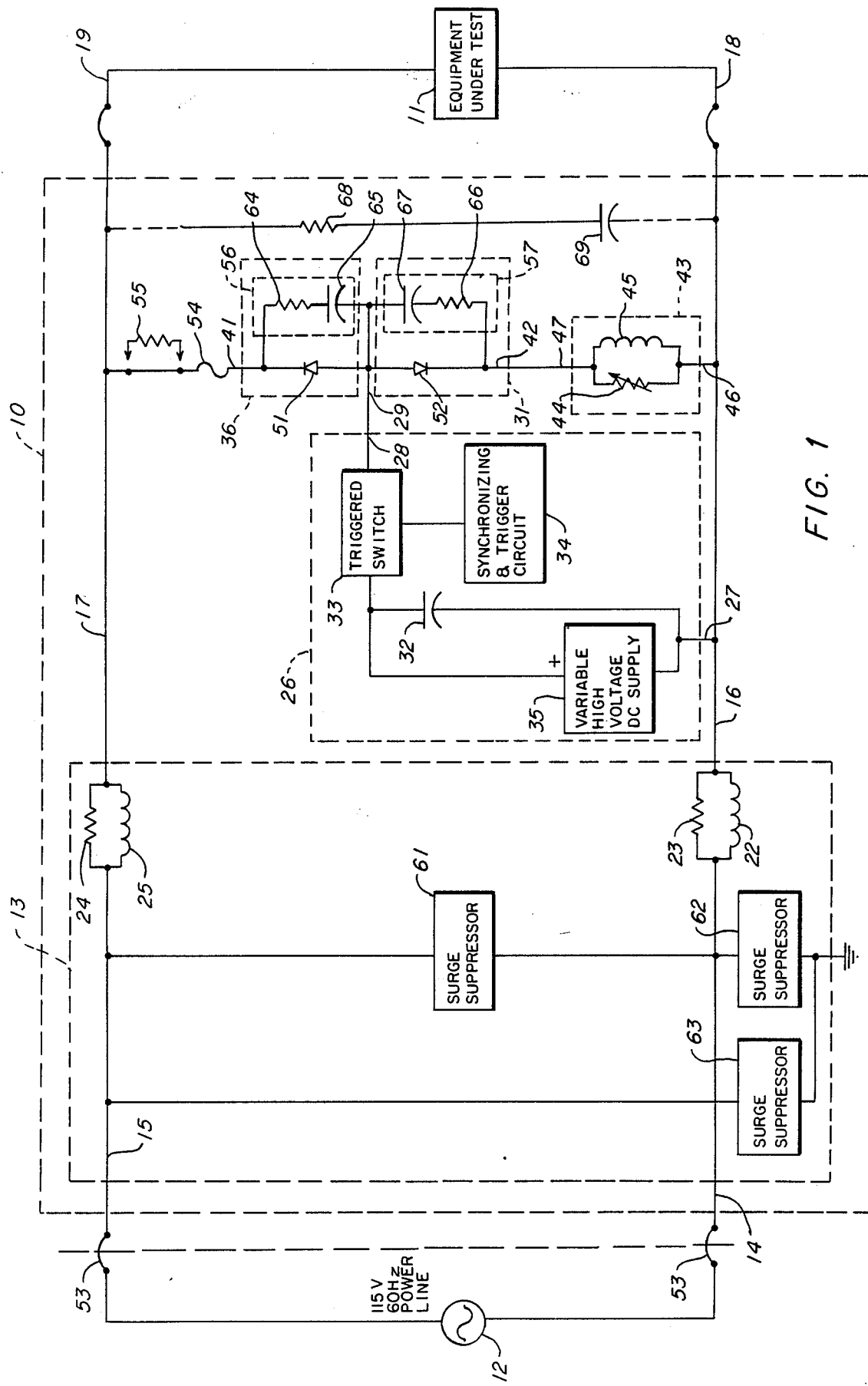
FIG. 1 is a schematic diagram showing the present invention in an embodiment suitable for applying line-to-line surges to an equipment under test (EUT).

Referring to FIG. 1, a preferred embodiment of a high voltage surge wave generator 10 is shown for the application of line-to-line surges to EUT 11. EUT 11 which is to be subjected to voltage stresses is operated from power source 12 and is isolated from power source 12 by surge filter 13 having first and second inputs 14 and 15 respectively connected to power source 12. First and second outputs 16 and 17 respectively of surge filter 13 are connected with corresponding first and second inputs 18 and 19 of the EUT. Within surge filter 13 are a first damper network comprising inductor 22 in parallel with resistor 23 and a second damper network comprising resistor 24 in parallel with inductor 25. The first damper network is connected in series between the first input 14 and the first output 16 of surge filter 13. The second damper network is connected in series between the second input 15 and the second output 17 of surge filter 13.

A surge wave generator is generally represented as 26. Surge wave generator 26 has a first output 27 connected to first output 16 of surge filter 13 and a second output 28 connected to input 29 of a first rectifier wave coupling network 31 and a second rectifier wave coupling network 36. Within surge wave generator 26, capacitor 32 is charged to the desired voltage by high level voltage dc supply 35. A high voltage surge wave is delivered at a second output 28 of surge wave generator 26 when the energy stored in capacitor 32 is discharged through triggered switch 33. In the preferred embodiments, an ignitron or a triggered spark gap may be used for triggered switch 33. Although both the ignitron and the triggered spark gap can be adapted to work under appropriate circumstances, the ignitron is most preferred because it causes a lower insertion loss than does the triggered spark gap. Triggered switch 33 is synchronized by trigger circuit 34 so that the high voltage surge wave can be applied to the load at any point along the voltage of power source 12.

The surge energy flows through a rectifier coupling network 31 having an input 29. The energy flows out of rectifier wave coupling network 31 through output 42 and out of rectifier wave coupling network 36 through output 41. The energy flows through output 42 of rectifier wave coupling network 31 into the input 47 of low impedance wave shaping network 43 and through output 41 of rectifier wave coupling network 35 to rest of the system including the power source 12, the surge filter 13 and the EUT 11.

Wave shaping network 43 and discharge capacitor 32 within surge wave generator 26 determine the open circuit decay time constant of the surge voltage waveform. The wave shaping network 43 has a first input 46 and a second input 47. Wave shaping network 43 comprises a variable resistor 44 in parallel with an inductor 45, a connection at one end of the parallel combination of resistor 44 and inductor 45 being electrically the same as the first input 46 of wave shaping network 43 and the other end of the parallel combination of resistor 44 and inductor 45 being electrically the same as the second input 47 of the wave shaping network 43. Depending upon the desired duration of the surge wave, wave shaping network 43 may alternately be simply a resistor or preferably a variable resistor 44.

The value of resistor 44 is used to adjust the decay time constant of the surge wave. This compensation is required to account for the effect of the power source and surge filter impedances which will vary with different power systems.

For calibration, the EUT 11 is disconnected from the system and the surge waveform is initially adjusted by setting the amplitude of the dc output voltage on variable high voltage supply 35 and the surge duration using resistor 44 in wave shaping load 43. After this initial adjustment, the EUT 11 is again connected to the system for test.

In the preferred embodiment, series rectifiers 51 and 52 are arranged with anodes commonly connected, isolating low impedance wave shaping load 43 from power source 12, enabling wave shaping load 43 to be connected in shunt without tripping breaker 53. Inductor 45 carries only a small amount of current. Its value is chosen depending on the range of surge durations that are required, where the longer the duration, the larger the value of inductor 45. For some durations, the inductor 45 may be eliminated altogether.

Voltage surges are generated when triggered switch 33 is activated by synchronizing and trigger circuit 34 and voltage surges are coupled into the system through rectifier 51. Since the surge voltage is applied in shunt, the same peak voltage will be obtained regardless of the amplitude of the power source 12 waveform at the time the surge waveform is applied.

Fuse 54 is connected in series with rectifiers 51 and 52 to protect low impedance wave shaping load 43 from fault current if either of the rectifiers 51 or 52 fails shorted. The most preferable type of fuse 54 is a motor starting fuse with a low continuous current rating and the inherent ability to withstand very high surge currents of short duration. Optional resistor 55 can be inserted in the circuit to limit the available short circuit surge current.

Snubber circuits 56 and 57 protect rectifiers 51 and 52 respectively from reverse voltage due to surge voltage undershoots occurring in the system and across wave shaping load 43. Snubber circuit 56 comprises resistor 64 in series with capacitor 65 and snubber circuit 57 comprises resistor 66 in series with capacitor 67.

Surge filter 13 protects power source 12 and other equipment (not illustrated) supplied by the power source from the voltage surge. Inductors 22 and 25 in surge filter 13 prevent unwanted suppression of the voltage surge by surge suppressors 61, 62, and 63 and also reduce the level of surge current which could otherwise flow through the surge suppressors 61, 62 and 63. Resistors 23 and 24 are preferably noninductive and are connected in parallel with inductors 22 and 25 respectively, providing damping and allowing the immediate flow of surge current. Without resistors 23 and 24, the inductance of the system initially prevents the flow of surge current and the voltage surge is superimposed on the voltage present across snubber capacitor 65 at the instant triggered switch 33 applies the voltage across capacitor 32 to the commonly connected anodes of rectifiers 51 and 52.

An instantaneous flow of surge current can also be engendered by connecting a dummy load comprised of a noninductive resistor 68 in series with a capacitor 69 across the inputs 18 and 19 to the EUT 11.

By way of illustration and not limitation, the following are typical values of components for providing a 2.5 kv peak voltage with a 50 us wide pulse measured at the 1.25 kv point to a 60 or 400 Hz power system: resistors 23 and 24, about 5 ohms; inductors 22 and 25, about 60 microhenries (uH); variable resistor 44, range 1 to about 10 ohms; resistor 55, about 0.5 ohms; resistors 64 and 66, about 1.2 ohms; capacitors 65 and 67, about 0.25 uF; resistor 68, about 200 ohms; and, capacitor 69, about 0.5 uF. For this set of operating values, inductor 45 is not required and may be taken out of the circuit.

Figure 3:
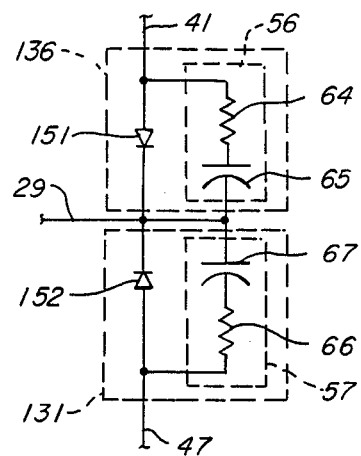
FIG. 3 is a schematic of an alternate embodiment of a portion of FIG. 1.

The first preferred embodiment as illustrated by reference to polarity of components as shown in the accompanying FIG. 1 is most suitable for the conduction of positive going surges into the equipment under test. It will be readily seen in view of this disclosure by those skilled in the art that by the reversal of the polarity of variable high voltage dc supply 35, the polarity of series rectifiers 51 and 52 and the polarity of any of capacitors 32, 65, 67 and 69 as may be polarized, negative going surges may be coupled equally as well. FIG. 3 is a schematic an alternate arrangement of a portion of the first embodiment shown in FIG. 1 and is adapted for coupling negative going surges to an equipment under test. Rectifier wave coupling networks 136 and 131 function analogously with networks 36 and 31 respectively except for polarity of surge waves that are coupled. The polarity of rectifiers 151 and 152 used for coupling negative going surge waves is reversed from the polarity of rectifiers 51 and 52 for coupling positive going surge waves. The network shown in FIG. 3 may be incorporated into the circuit shown in FIG. 1 by breaking the FIG. 1 circuit at 29, 41 and 47 and connecting the identically labeled points of 29, 41 and 47 which are shown in FIG. 3.

Figure 2:
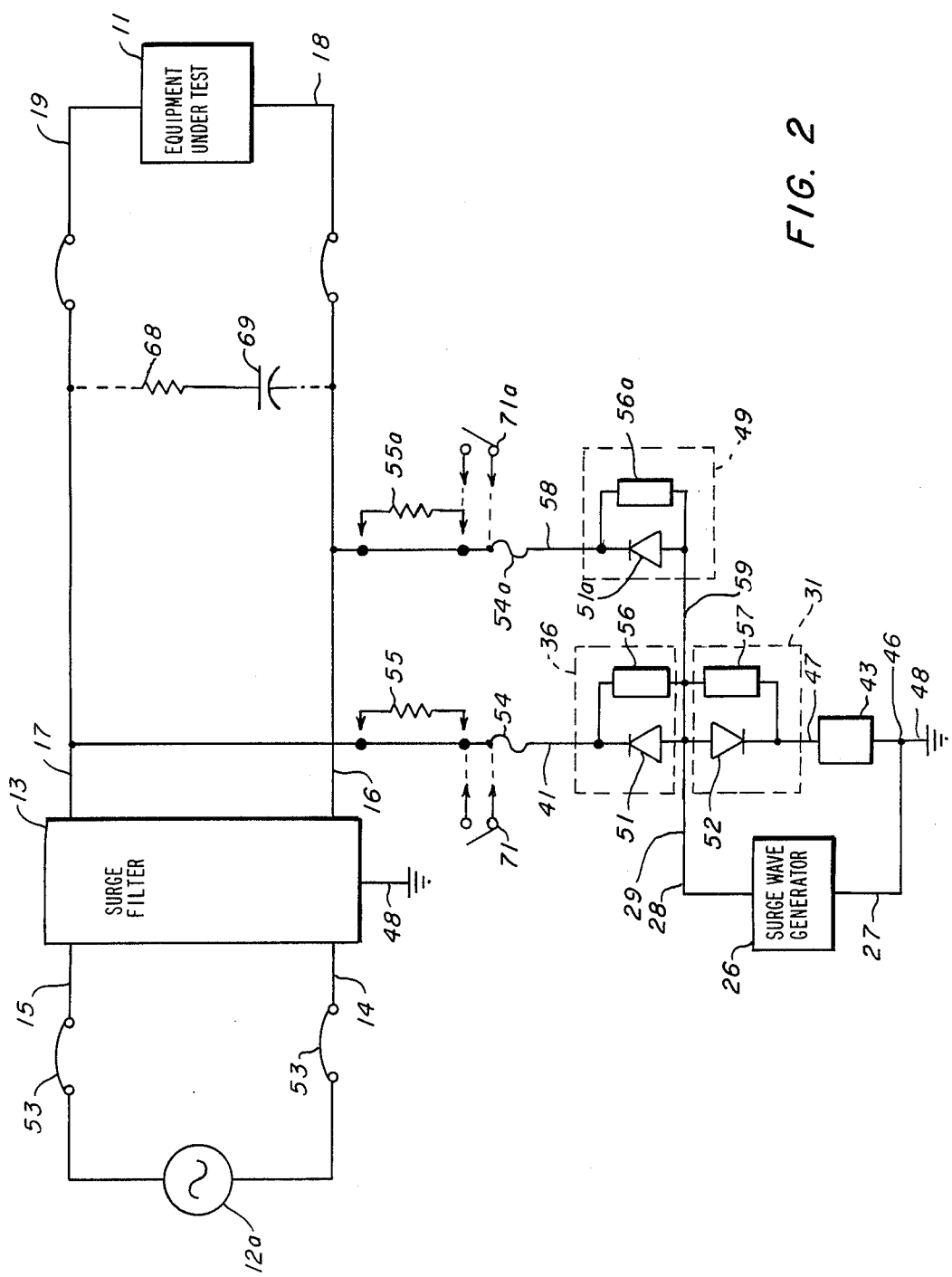
FIG. 2 is a schematic diagram showing the present invention in an embodiment suitable for applying line-to-ground surges to an EUT.

A second preferred embodiment is shown illustrated in FIG. 2. As can be seen by comparison of the figures, this embodiment is similar to the embodiment shown in FIG. 1. The differences are that first input 46 of wave shaping network 43 is electrically connected to first output 27 of surge voltage source 26 and the common point of input 46 and output 27 is electrically connected to electrical ground 48 rather than to the common point of first output 16 of surge filter 13 and first input 18 of equipment under test 11 as is shown in the first preferred embodiment. Additionally, third rectifier wave coupling network 49 further comprising rectifier 51a in parallel with snubber circuit 56a is connected with input terminal 59 electrically in common with input 29 of first rectifier wave coupling network 31 and second rectifier wave coupling network 36. Rectifier 51a is of such polarity as to conduct the voltage surge to the common connection of first output 16 of surge filter 13 and first input 18 of unit under test 11. Snubber circuit 56a is similarly constructed and performs a similar function as snubber 56 in the first preferred embodiment. Output 58 of third rectifier wave coupling network 49 is electrically connected through fuse 54a and optional resistor 55a to the electrically common point of first output 16 of surge filter 13 and first input 18 of unit under test 11. With the second embodiment, both inputs 18 and 19 of unit under test 11 can be surged simultaneously with respect to ground. Further, electrical switches 71 and 71a may be interposed in series with fuses 54 and 54a, respectively, allowing an arrangement whereby the power lines may be selectively surged individually or surged simultaneously.

Figure 4:
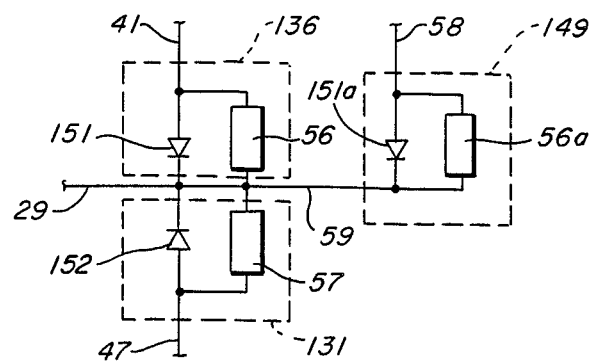
FIG. 4 is a schematic of an alternate embodiment of a portion of FIG. 2.

Similarly as with the first preferred embodiment, the second preferred embodiment may be easily adapted for conducting negative going pulses to an equipment under test. FIG. 4 illustrates the circuit changes required. Referring now to FIG. 4, rectifier wave coupling networks 136, 131 and 149 function analogously with networks 36, 49 respectively except for polarity of surge waves that are coupled. The polarity of rectifiers 151, 152 and 151a which are used for coupling negative going surge waves is reversed from the polarity of rectifiers 51, 52 and 52a for coupling positive going surge waves. The network shown in FIG. 4 may be incorporated into the circuit shown in FIG. 2 by breaking the FIG. 2 circuit at 29, 41, 47 and 58 and connecting the identically labeled points of 29, 41, 47, and 58 which are shown in FIG. 4.

Although the embodiments of FIG. 1 and FIG. 2 are illustrated by reference to a single-phase alternating current circuit, it will be readily understood by those skilled in the art that these embodiments may be readily adapted to both dc circuits and polyphase alternating circuits.

Figure 5:
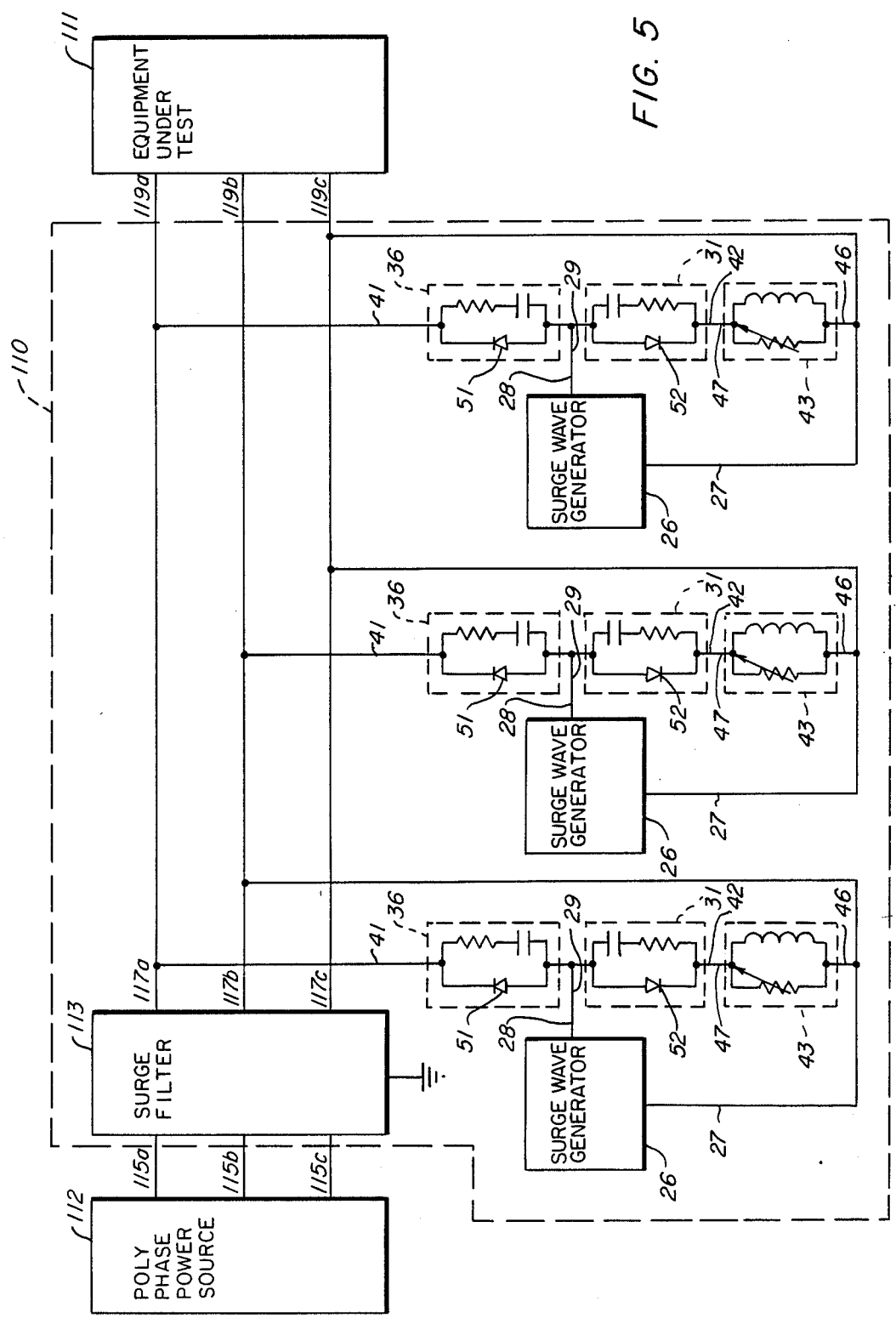
FIG. 5 is a schematic diagram showing the present invention in an embodiment suitable for applying line-to-line surges to an EUT operating from a polyphase power system.

An example of an adaptation of the present invention for polyphase circuits is shown in FIG. 5. Referring now to FIG. 5, an apparatus for subjecting an equipment under test to an impulse waveform where the equipment under test is being operated from a polyphase electrical power source is indicated by 110. Surge filter 113 has a plurality of inputs 115, further labeled a,b and c, connected to power source 112 and a plurality of outputs 117, likewise further labeled a,b and c, connected to a plurality of inputs 119, also further labeled a, b and c, of an equipment under test 111. A plurality of impulse generators 26 are used. Each generator 26 has a first output 27 connected to one output 117 of surge filter 113 and has a second output 28. A plurality of wave shaping networks 43 are used. Each wave shaping network 43 has one input 46 connected with one output 117 of surge filter 113 and has a second input 47. A plurality of first rectifier wave coupling networks 31 are used. Each network 31 has an input 29 connected to second output 28 of one impulse generator 26. Each first rectifier wave coupling network 31 has an output 42 connected to second input 47 wave shaping network 43. A plurality of second rectifier wave coupling networks 36 are used. Each second rectifier wave coupling network 36 has an input which is common with input 29 of first rectifier wave coupling network 31 and is also common with output 28 of one surge wave generator 26.

Each first rectifier network 31 further comprises a rectifier 52 having an anode connected to input 29 and a cathode connected to output 42. Each second rectifier network 36 further comprises a rectifier 51 having a cathode connected in common with input 29 and and an anode connected at output 41. The alternate circuit portion shown in FIG. 3, is an equally adaptable variation of the circuit configuration shown in FIG. 5. By breaking the circuit shown in FIG. 5 at each point 29, 41, and 47 and into each set of 29, 41 and 47, inserting the circuit shown in FIG. 3, the circuit is suitably adapted for conducting negative going pulses into an equipment under test 111. When adapted for the coupling of negative going pulses, each first rectifier network 131 further comprises a rectifier 152 having a cathode connected to input 29 and an anode connected to output 42. Each second rectifier network 136 further comprises a rectifier 151 having a cathode connected in common with input 29 and an anode connected at output 41.

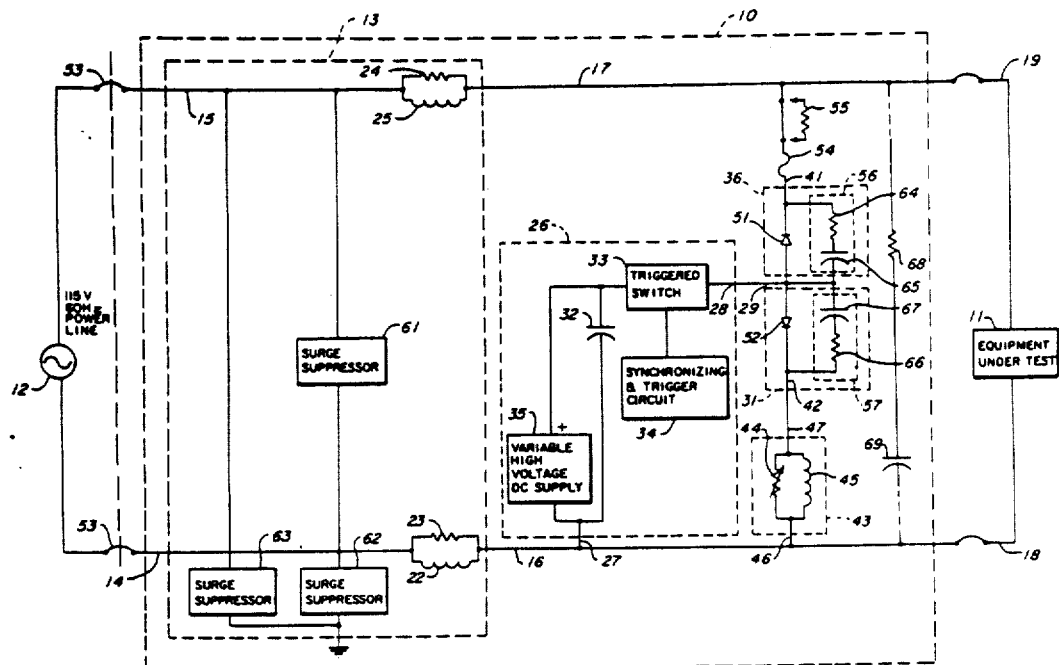

What is claimed is:

1. An apparatus for subjecting an equipment under test to an impulse waveform, said equipment under test being operated from an electrical power source, comprising:
   (a) a surge filter having first and second inputs connected to said power source and first and second outputs connected to first and second inputs of said equipment under test;
   (b) an impulse generator having a first output connected to said first output of said surge filter and having a second output;
   (c) a wave shaping network having a first input connected to said first output of said surge filter and having a second input;
   (d) a first rectifier wave coupling network having an input connected to the second output of said impulse generator, said first rectifier wave coupling network having an output connected to said second input of said wave shaping network; and,
   (e) a second rectifier wave coupling network, said second rectifier coupling network having an input connected to the input of said first rectifier coupling network and an output connected to said second output of said surge filter.

2. An apparatus for subjecting an equipment under test to an impulse waveform as claimed in claim 1 wherein each said first and second rectifier wave coupling network further comprises a rectifier having the anode thereof connected to the input of each said first and second rectifier wave coupling network and having the cathode thereof connected to the output of each said first and second rectifier wave coupling network.

3. An apparatus for subjecting an equipment under test to an impulse waveform as claimed in claim 1 wherein each said first and second rectifier wave coupling network further comprises a rectifier having the cathode thereof connected to the input of each said first and second rectifier wave coupling network and having the anode thereof connected to the output of each said first and second rectifier wave coupling network.

4. An apparatus for subjecting an equipment under test to an impulse waveform as claimed in claim 2 or claim 3 further comprising a snubber circuit electrically in parallel with each said rectifier.

5. An apparatus for subjecting an equipment under test to an impulse waveform as claimed in claim 4 wherein each snubber circuit further comprises a capacitor electrically in series with a resistor.

6. An apparatus for subjecting an equipment under test to an impulse waveform as claimed in claim 1 wherein said apparatus further comprises a dummy load connected between the first and second inputs of said equipment under test.

7. An apparatus for subjecting an equipment under test to an impulse waveform as claimed in claim 6 wherein said dummy load further comprises a capacitor electrically in series with a resistor.

8. An apparatus for subjecting an equipment under test to an impulse waveform as claimed in claim 1 wherein said wave shaping network further comprises a resistor electrically in parallel with an inductor.

9. An apparatus for subjecting an equipment under test to an impulse waveform as claimed in claim 8 wherein said resistor is variable.

10. An apparatus for subjecting an equipment under test to an impulse waveform as claimed in claim 1 wherein said surge filter further comprises a damper network connected between each said input and each said output of said surge filter.

11. An apparatus for subjecting an equipment under test to an impulse waveform as claimed in claim 10 wherein each said damper network further comprises a resistor in parallel with an inductor.

12. An apparatus for subjecting an equipment test to an impulse waveform, said equipment under test being operated from a polyphase electrical power source, comprising:
 (a) a surge filter having a plurality of input connected to said power source and a plurality of outputs connected to a plurality of inputs of an equipment under test;
 (b) a plurality of impulse generators each having a first output connected to one of said plurality of outputs of said surge filter and having a second output;
 (c) a plurality of wave shaping networks each having a first input connected to one of said plurality of outputs of said surge filter and having a second input; and,
 (d) a plurality of first rectifier wave coupling networks, each said first rectifier wave coupling network having an input connected to the second output of one of said plurality of impulse generators, each said first rectifier wave coupling network having an output connected to the second input of one of said plurality of wave shaping networks; and
 (e) a plurality of second rectifier wave coupling networks, each said second rectifier coupling network having an input connected to the input of one of said plurality of first rectifier coupling networks and an output connected to one of said plurality of outputs of said surge filter.

13. An apparatus for subjecting an equipment under test to an impulse waveform as claimed in claim 12 wherein each said first and second rectifier wave coupling network further comprises a rectifier having the anode thereof connected to the input of each said first and second rectifier wave coupling network and having the cathode thereof connected to the output of each said first and second rectifier wave coupling network.

14. An apparatus for subjecting an equipment under test to an impulse waveform as claimed in claim 12 wherein each said first and second rectifier wave coupling network further comprises a rectifier having the cathode thereof connected to the input of each said first and second rectifier wave coupling network and having the anode thereof connected to the output of each said first and second rectifier wave coupling network.

15. An apparatus for subjecting an equipment under test to an impulse waveform, said equipment under test being operated from a grounded electrical power source, comprising:
 (a) a surge filter having a plurality of inputs connected to said power source and a plurality of outputs connected to a plurality of inputs of said equipment under test;
 (b) an impulse generator having a first output connected to the ground of said grounded electrical power source and having a second output;
 (c) a wave shaping network having a first input connected to the ground of said electrical power source and having a second input;
 (d) a first rectifier wave coupling network having an input connected to the second output of said impulse generator, said first rectifier wave coupling network having an output connected to said second input of said wave shaping network; and,
 (e) at least one second rectifier wave coupling network, each said second rectifier coupling network having an input connected to the input of said first rectifier coupling network and an output connected to one said output of said surge filter.

16. An apparatus for subjecting an equipment under test to an impulse waveform as claimed in claim 15 wherein each said first and second rectifier wave coupling network further comprises a rectifier having the anode thereof connected to the input of each said first and second rectifier wave coupling network and having the cathode thereof connected to the output of each said first and second rectifier wave coupling network.

17. An apparatus for subjecting an equipment under test to an impulse waveform as claimed in claim 15 wherein each said first and second rectifier wave coupling network further comprises a rectifier having the cathode thereof connected to the input of each said first and second rectifier wave coupling network and having the anode thereof connected to the output of each said first and second rectifier wave coupling network.

18. An apparatus for subjecting an equipment under test to an impulse waveform as claimed in claim 16 or claim 17 further comprising a snubber circuit electrically in parallel with each said rectifier.

19. An apparatus for subjecting an equipment under test to an impulse waveform as claimed in claim 18 wherein each said snubber circuit further comprises a capacitor electrically in series with a resistor.

20. An apparatus for subjecting an equipment under test to an impulse waveform as claimed in claim 15 wherein said apparatus further comprises a plurality of dummy loads wherein one said dummy load is connected between an input of said equipment under test and the ground of said electrical power source.

21. An apparatus for subjecting an equipment under test to an impulse waveform as claimed in claim 20 wherein said dummy load further comprises a capacitor electrically in series with a resistor.

22. An apparatus for subjecting an equipment under test to an impulse waveform as claimed in claim 15 wherein said wave shaping network further comprises a resistor electrically in parallel with an inductor.

23. An apparatus for subjecting an equipment under test to an impulse waveform as claimed in claim 22 wherein said resistor is variable.

24. An apparatus for subjecting an equipment under test to an impulse waveform as claimed in claim 15 wherein said surge filter further comprises a damper network connected between each said input and each said output of said surge filter.

25. An apparatus for subjecting an equipment under test to an impulse waveform as claimed in claim 24 wherein each said damper network further comprises a resistor in parallel with an inductor.

* * * * *

UNITED STATES PATENT OFFICE
CERTIFICATE OF CORRECTION

Patent No. 4,868,505                    Dated September 19, 1989

Inventor(s) George J. Stahl

It is certified that error appears in the above-identified patent and that said Letters Patent is hereby corrected as shown below:

On the title page, insert:

-- Assignee:  The United States of America as represented by the Secretary of the Navy, Washington, D.C.--.

Signed and Sealed this

Twenty-second Day of January, 1991

Attest:

HARRY F. MANBECK, JR.

*Attesting Officer*    *Commissioner of Patents and Trademarks*

UNITED STATES PATENT AND TRADEMARK OFFICE
CERTIFICATE OF CORRECTION

PATENT NO. : 4,868,505

DATED : September 19, 1989

INVENTOR(S) : Stahl

Page 1 of 2

It is certified that error appears in the above-identified patent and that said Letters Patent is hereby corrected as shown below:

The title page should be deleted to appear as per attached title page.

Signed and Sealed this

Nineteenth Day of March, 1991

Attest:

HARRY F. MANBECK, JR.

*Attesting Officer*

Commissioner of Patents and Trademarks

United States Patent [19]

Stahl

[11] Patent Number: 4,868,505
[45] Date of Patent: Sep. 19, 1989

[54] HIGH VOLTAGE IMPULSE WAVE GENERATOR FOR TESTING EQUIPMENT

[76] Inventor: George J. Stahl, 428 Ben Oaks Dr., East, Severna Park, Md. 21146

[73] Assignee: The United States of America as represented by the Secretary of the Navy, Washington, D.C.

[21] Appl. No.: 204,324

[22] Filed: Jun. 9, 1988

[51] Int. Cl.[4] .................... G01R 31/02; H03K 3/01
[52] U.S. Cl. ................................ 324/511; 324/510; 324/546; 307/107
[58] Field of Search ....... 324/57 PS, 500, 509-14 511, 324/527, 531, 536, 537, 539, 541, 546, 547, 551-554, 73 R, 158 MG, 545, 55; 361/111; 328/65-67; 307/268, 106-108

[56] References Cited

U.S. PATENT DOCUMENTS

| | | | |
|---|---|---|---|
| 2,578,499 | 12/1951 | Bauer | 324/546 |
| 3,622,882 | 11/1971 | Gardner | 324/158 MG |
| 3,869,664 | 3/1975 | Safer et al. | 324/546 |
| 3,932,806 | 1/1976 | Kawada | 324/546 |
| 4,683,514 | 7/1987 | Cook | 361/111 |

*Primary Examiner*—Reinhard J. Eisenzopf
*Assistant Examiner*—Jack B. Harvey
*Attorney, Agent, or Firm*—Luther A. Marsh; John H. Stowe

[57] ABSTRACT

A generator for subjecting an electrical apparatus to a surge voltage. The generator includes a surge voltage generator, a line isolation surge filter, wave shaping circuits and a rectifier coupling network for coupling the surge voltages in shunt with the power line and the equipment under test.

25 Claims, 4 Drawing Sheets